United States Patent
Shima

(10) Patent No.: US 9,862,185 B2
(45) Date of Patent: Jan. 9, 2018

(54) LIQUID DISCHARGE APPARATUS, HEAD UNIT, CAPACITIVE LOAD DRIVE CIRCUIT, AND INTEGRATED CIRCUIT DEVICE FOR CAPACITIVE LOAD DRIVE

(71) Applicant: Seiko Epson Corporation, Tokyo (JP)

(72) Inventor: Shunichi Shima, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/377,382

(22) Filed: Dec. 13, 2016

(65) Prior Publication Data

US 2017/0087831 A1      Mar. 30, 2017

Related U.S. Application Data

(63) Continuation of application No. 14/959,376, filed on Dec. 4, 2015, now Pat. No. 9,550,356.

(30) Foreign Application Priority Data

Jan. 28, 2015 (JP) ................... 2015-014095

(51) Int. Cl.
*B41J 2/045* (2006.01)

(52) U.S. Cl.
CPC ....... *B41J 2/04541* (2013.01); *B41J 2/04586* (2013.01)

(58) Field of Classification Search
CPC ............ B41J 2/04541; B41J 2/04581; B41J 2/04586; H03K 19/018507
See application file for complete search history.

(56) References Cited

U.S. PATENT DOCUMENTS

| 2006/0267679 | A1 | 11/2006 | Maekawa |
| 2007/0057721 | A1 | 3/2007 | Risbo et al. |
| 2007/0187762 | A1 | 8/2007 | Saiki et al. |
| 2009/0212356 | A1 | 8/2009 | Yamada |
| 2012/0120136 | A1* | 5/2012 | Oshima ............... B41J 2/04541 347/10 |
| 2013/0187966 | A1 | 7/2013 | Abe |

FOREIGN PATENT DOCUMENTS

JP      2010-114711 A      5/2010

* cited by examiner

*Primary Examiner* — Bradley Thies
(74) *Attorney, Agent, or Firm* — Harness, Dickey & Pierce, P.L.C.

(57) ABSTRACT

A driving circuit for driving a capacitive load includes an integrated circuit device that includes a modulation portion which generates a modulation signal by pulse-modulating a source signal; a feedback circuit; a transistor that generates an amplified modulation signal which is obtained by amplifying the modulation signal; a low-pass filter that generates a drive signal by demodulating the amplified modulation signal; and a piezoelectric element that is displaced by applying the drive signal, wherein the feedback circuit generates a feedback signal on the basis of the drive signal, and feeds back the feedback signal to the modulation portion through a feedback terminal, the modulation portion includes a first circuit block and a second circuit block, and the integrated circuit device is configured to separate the first circuit block from the second circuit block by a triple-well structure.

6 Claims, 11 Drawing Sheets

<DECODE CONTENT OF DECODER>

| PRINTING DATA Data | T1 | | T2 | |
|---|---|---|---|---|
| | Sa | Sb | Sa | Sb |
| (1, 1) | H | L | H | L |
| (0, 1) | H | L | L | H |
| (1, 0) | L | L | L | H |
| (0, 0) | L | H | L | L |

MSB  LSB

LIQUID DISCHARGE APPARATUS, HEAD UNIT, CAPACITIVE LOAD DRIVE CIRCUIT, AND INTEGRATED CIRCUIT DEVICE FOR CAPACITIVE LOAD DRIVE

CROSS-REFERENCE TO RELATED APPLICATIONS

This is a continuation patent application of U.S. application Ser. No. 14/959,376 filed Dec. 4, 2015, which claims priority to Japanese Patent Application No. 2015-014095 filed Jan. 28, 2015, both of which are expressly incorporated by reference herein in their entireties.

BACKGROUND

1. Technical Field

The present invention relates to a liquid discharge apparatus, a head unit, a capacitive load drive circuit, and an integrated circuit device for capacitive load drive.

2. Related Art

In a liquid discharge apparatus such as an ink jet printer which prints an image or a document by discharging an ink, a liquid discharge apparatus using a piezoelectric element (for example, a piezo element) is known. The piezoelectric elements are respectively arranged by correlating with a plurality of nozzles in a head unit, and each thereof are driven in accordance with a drive signal. Thereby, a predetermined amount of the ink (liquid) is discharged at a predetermined timing from the nozzle, and dots are formed. Since the piezoelectric element is a capacitive load such as a capacitor if being electrically viewed, there is a need to supply a sufficient current in order to operate the piezoelectric element of each nozzle.

Therefore, in the liquid discharge apparatus described above, a configuration of driving the piezoelectric element by supplying the drive signal which is amplified by an amplification circuit to the head unit (ink jet head), is made. As an amplification circuit, a system of performing the current amplification of a source signal before the amplification by a Class AB amplifier or the like is used, but since energy efficiency is poor, a Class D amplifier is offered in recent years (see JP-A-2010-114711).

In order to obtain the discharge accuracy (an output waveform is made to be highly accurate) in the Class D amplifier for the ink jet head, a high oscillation frequency (1 MHz to 8 MHz) which is 20 times or more in comparison with the Class D amplifier for an audio, is necessary. However, there is a feature of being likely to be affected by various types of noises due to the high oscillation frequency. Therefore, the inventors of the invention have been found that a component layout of an IC of which importance to be checked is small in the Class D amplifier for the audio, is important for a noise reduction in the Class D amplifier for the ink jet head.

SUMMARY

An advantage of some aspects of the invention is to provide a liquid discharge apparatus, a head unit, a capacitive load drive circuit, and an integrated circuit device for capacitive load drive that can improve discharge accuracy of a liquid.

The invention can be realized in the following aspects or application examples.

Application Example 1

According to this application example, there is provided a liquid discharge apparatus including an integrated circuit device that includes a modulation portion which generates a modulation signal by pulse-modulating a source signal, a feedback circuit, a transistor that generates an amplified modulation signal which is obtained by amplifying the modulation signal, a low-pass filter that generates a drive signal by demodulating the amplified modulation signal, a piezoelectric element that is displaced by applying the drive signal, a cavity where an inner portion is filled with a liquid, and an internal volume is changed by the displacement of the piezoelectric element, and a nozzle that communicates with the cavity, and discharges the liquid of the cavity as a droplet depending on the change of the internal volume of the cavity, in which the feedback circuit generates a feedback signal on the basis of the drive signal, and feeds back the feedback signal to the modulation portion through a feedback terminal, the modulation portion includes a first circuit block including an adder which is on a signal path from the feedback terminal to an output of the modulation portion, and a second circuit block including at least a portion of a circuit which is different from the adder of the modulation portion, and the integrated circuit device is configured to separate the first circuit block from the second circuit block by a triple-well structure.

In this case, since the adder which is likely to be affected by a noise is separated from other circuits by the triple-well structure, it is possible to make a parasitic capacitance of the first circuit block including the adder smaller. Thereby, since it is possible to suppress that the noises which are generated by other circuit blocks go around the adder, the modulation portion can generate the accurate modulation signal. Therefore, since it is possible to control a voltage which is applied to the piezoelectric element with high accuracy, it is possible to realize the liquid discharge apparatus that can improve the discharge accuracy of the liquid.

Application Example 2

In the liquid discharge apparatus according to the application example, an area of a well where the first circuit block is formed, may be smaller than an area of a well where the second circuit block is formed in a planar view.

In this case, it is possible to make the parasitic capacitance of the first circuit block including the adder smaller. Thereby, since it is possible to suppress that the noises which are generated by other circuit blocks go around the adder, the modulation portion can generate the accurate modulation signal. Therefore, since it is possible to control the voltage which is applied to the piezoelectric element with high accuracy, it is possible to realize the liquid discharge apparatus that can improve the discharge accuracy of the liquid.

Application Example 3

In the liquid discharge apparatus according to the application example, the first circuit block may further include a signal level conversion portion that converts a level of the feedback signal.

In this case, since the adder which is likely to be affected by the noise and the signal level conversion portion are separated from other circuits by the triple-well structure, it is possible to make the parasitic capacitance of the first circuit block including the adder and the signal level conversion portion smaller. Thereby, since it is possible to suppress that the noises which are generated by other circuit blocks go around the adder, the modulation portion can generate the accurate modulation signal. Therefore, since it is possible to control the voltage which is applied to the piezoelectric element with high accuracy, it is possible to realize the liquid discharge apparatus that can improve the discharge accuracy of the liquid.

Application Example 4

In the liquid discharge apparatus according to the application example, the feedback circuit may feedback a signal of a high frequency band of the drive signal as the feedback signal.

In this case, by feeding back the signal of the high frequency band of the drive signal as the feedback signal, the modulation portion can generate the accurate modulation signal. Moreover, it is possible to reduce an influence of the noise on the high frequency signal which is likely to be affected by the noise. Therefore, since it is possible to control the voltage which is applied to the piezoelectric element with high accuracy, it is possible to realize the liquid discharge apparatus that can improve the discharge accuracy of the liquid.

Application Example 5

In the liquid discharge apparatus according to the application example, an oscillation frequency of the modulation signal may be 1 MHz or higher to 8 MHz or lower.

In the liquid discharge apparatus described above, the drive signal is generated by smoothing the amplified modulation signal, and the piezoelectric element is displaced by applying the drive signal, and the liquid is discharged from the nozzle. Here, for example, if the liquid discharge apparatus performs a frequency spectrum analysis of the waveform of the drive signal for discharging small dots, it is confirmed that a frequency component of 50 kHz or higher is included. In order to generate the drive signal including the frequency component of 50 kHz or higher, there is a need that the frequency of the modulation signal (frequency of self-oscillation) is 1 MHz or higher.

If the frequency is lower than 1 MHz, an edge of the waveform of the drive signal which is reproduced becomes dull and round. In other words, the waveform becomes dull by that an angle is softened. If the waveform of the drive signal is dull, the displacement of the piezoelectric element which is operated depending on a rise edge and a fall edge of the waveform becomes gentle, and a tailing at the time of the discharging, a discharge failure or the like is generated, and quality of the printing is lowered.

On the other hand, if the frequency of the self-oscillation is higher than 8 MHz, resolving power of the waveform of the drive signal increases. However, since a switching frequency is climbed in the transistor, a switching loss becomes large, and power saving properties and heating saving properties which have predominance in comparison with a linear amplification such as a Class AB amplifier, are damaged.

Therefore, in the liquid discharge apparatus described above, the frequency of the modulation signal is preferably 1 MHz or higher to 8 MHz or lower.

Application Example 6

According to this application example, there is provided a head unit including an integrated circuit device that includes a modulation portion which generates a modulation signal by pulse-modulating a source signal, a feedback circuit, a transistor that generates an amplified modulation signal which is obtained by amplifying the modulation signal, a low-pass filter that generates a drive signal by demodulating the amplified modulation signal, a piezoelectric element that is displaced by applying the drive signal, a cavity where an inner portion is filled with a liquid, and an internal volume is changed by the displacement of the piezoelectric element, and a nozzle that communicates with the cavity, and discharges the liquid of the cavity as a droplet depending on the change of the internal volume of the cavity, in which the feedback circuit generates a feedback signal on the basis of the drive signal, and feeds back the feedback signal to the modulation portion through a feedback terminal, the modulation portion includes a first circuit block including an adder which is on a signal path from the feedback terminal to an output of the modulation portion, and a second circuit block including at least a portion of a circuit which is different from the adder of the modulation portion, and the integrated circuit device is configured to separate the first circuit block from the second circuit block by a triple-well structure.

In this case, since the adder which is likely to be affected by the noise is separated from other circuits by the triple-well structure, it is possible to make the parasitic capacitance of the first circuit block including the adder smaller. Thereby, since it is possible to suppress that the noises which are generated by other circuit blocks go around the adder, the modulation portion can generate the accurate modulation signal. Therefore, since it is possible to control the voltage which is applied to the piezoelectric element with high accuracy, it is possible to realize the head unit that can improve the discharge accuracy of the liquid.

Application Example 7

According to this application example, there is provided a capacitive load drive circuit including an integrated circuit device that includes a modulation portion which generates a modulation signal by pulse-modulating a source signal, a feedback circuit, a transistor that generates an amplified modulation signal which is obtained by amplifying the modulation signal, and a low-pass filter that generates a drive signal by demodulating the amplified modulation signal, and outputs a capacitive load, in which the feedback circuit generates a feedback signal on the basis of the drive signal, and feeds back the feedback signal to the modulation portion through a feedback terminal, the modulation portion includes a first circuit block including an adder which is on a signal path from the feedback terminal to an output of the modulation portion, and a second circuit block including at least a portion of a circuit which is different from the adder of the modulation portion, and the integrated circuit device is configured to separate the first circuit block from the second circuit block by a triple-well structure.

In this case, since the adder which is likely to be affected by the noise is separated from other circuits by the triple-well structure, it is possible to make the parasitic capacitance of the first circuit block including the adder smaller. Thereby, since it is possible to suppress that the noises which are generated by other circuit blocks go around the adder, the modulation portion can generate the accurate modulation signal. Therefore, it is possible to realize the capacitive load drive circuit that can control the voltage which is applied to the capacitive load with high accuracy.

Application Example 8

According to this application example, there is provided an integrated circuit device for capacitive load drive including a modulation portion that generates a modulation signal by pulse-modulating a source signal, and a gate driver that generates an amplified control signal for controlling an output circuit which generates a drive signal for driving a capacitive load, on the basis of the modulation signal, in which in the modulation portion, a feedback signal which is generated on the basis of the drive signal, is fed back through a feedback terminal, the modulation portion includes a first circuit block including an adder which is on a signal path from the feedback terminal to an output of the modulation portion, and a second circuit block including at least a portion of a circuit which is different from the adder of the modulation portion, and the first circuit block and the second circuit block are configured to be separated by a triple-well structure.

In this case, since the adder which is likely to be affected by the noise is separated from other circuits by the triple-well structure, it is possible to make the parasitic capacitance of the first circuit block including the adder smaller. Thereby, since it is possible to suppress that the noises which are generated by other circuit blocks go around the adder, the modulation portion can generate the accurate modulation signal. Therefore, it is possible to realize the integrated circuit device for capacitive load drive that can control the voltage which is applied to the capacitive load with high accuracy.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, suitable embodiments of the invention will be described in detail by using drawings. The used drawings are for convenience of the description. Furthermore, the embodiments described below do not unjustly limit the contents of the invention which are written in the scope of the claims. Moreover, all of configurations which are described below are not necessarily to be compulsory configuration components of the invention.

1. Outline of Liquid Discharge Apparatus

A printing apparatus as an example of a liquid discharge apparatus according to the embodiment, is an ink jet printer that forms an ink dot group on a printing medium such as paper by discharging an ink in accordance with image data which is supplied from an external host computer, and prints an image (including a character, a figure or the like) in accordance with the image data.

As a liquid discharge apparatus, for example, it is possible to use a printing apparatus such as a printer, a color material discharge apparatus which is used for manufacturing a color filter such as a liquid crystal display, an electrode material discharge apparatus which is used for forming an electrode such as an organic EL display or a field emission display (FED), or a living body organic matter discharge apparatus which is used for manufacturing a biochip.

Figure 1:
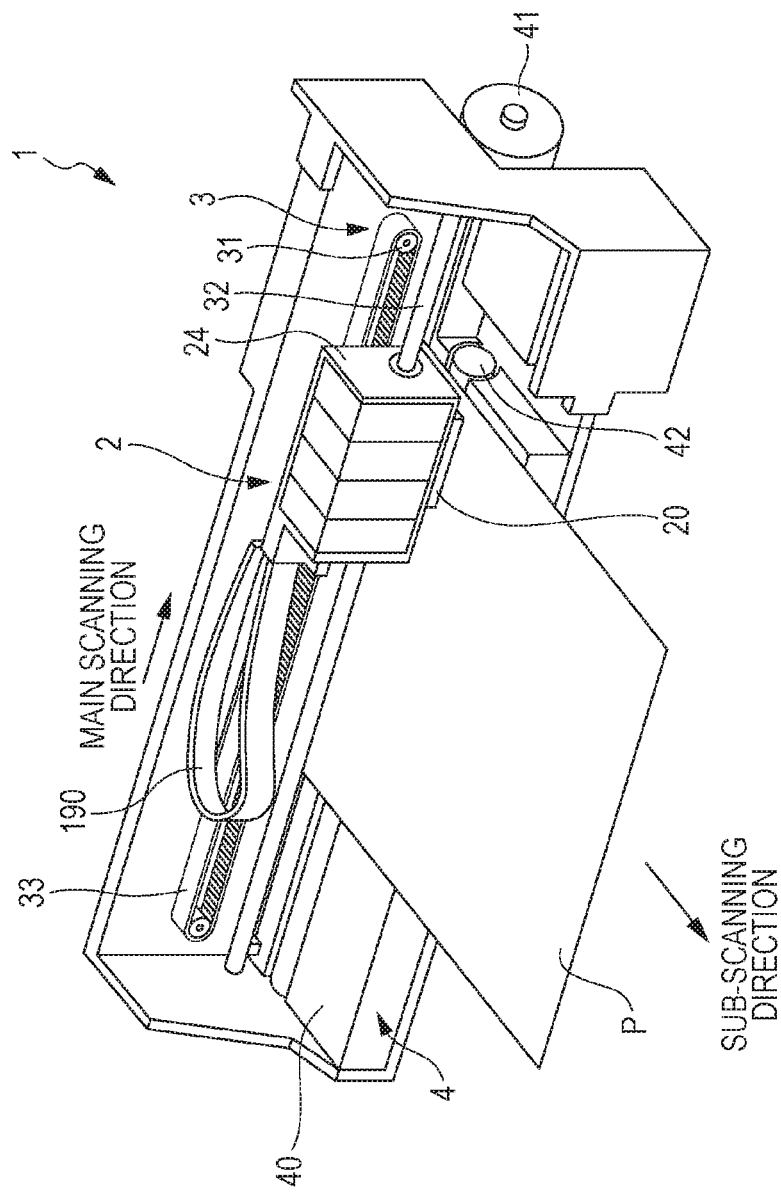
FIG. 1 is a view illustrating a schematic configuration of a liquid discharge apparatus.

FIG. 1 is a perspective view illustrating a schematic configuration of an inner portion of a liquid discharge apparatus 1. As illustrated in FIG. 1, the liquid discharge apparatus 1 includes a moving body 2, and a moving mechanism 3 which moves (reciprocates) in a main scanning direction.

The moving mechanism 3 includes a carriage motor 31 which becomes a drive source of the moving body 2, a carriage guide shaft 32 of which both ends are fixed, and a timing belt 33 which is extended in substantially parallel with the carriage guide shaft 32 and is driven by the carriage motor 31.

A carriage 24 of the moving body 2 is reciprocatingly supported by the carriage guide shaft 32, and is fixed to a portion of the timing belt 33. Therefore, if the timing belt 33 is run forward and backward by the carriage motor 31, the moving body 2 reciprocates by being guided with the carriage guide shaft 32.

Among the moving body 2, a head unit 20 is arranged in a portion facing a printing medium P. As described later, the head unit 20 is a unit for discharging ink droplets (liquid droplets) from a plurality of nozzles, and has a configuration in which various types of control signals are supplied through a flexible cable 190.

The liquid discharge apparatus 1 includes a transport mechanism 4 that transports the printing medium P on a platen 40 in a sub-scanning direction. The transport mechanism 4 includes a transport motor 41 being a drive source, and a transport roller 42 that is rotated by the transport motor 41, and transports the printing medium P in the sub-scanning direction.

Since the head unit 20 discharges the ink droplets onto the printing medium P at the timing of transporting the printing medium P by the transport mechanism 4, the image is formed on a surface of the printing medium P.

Figure 2:
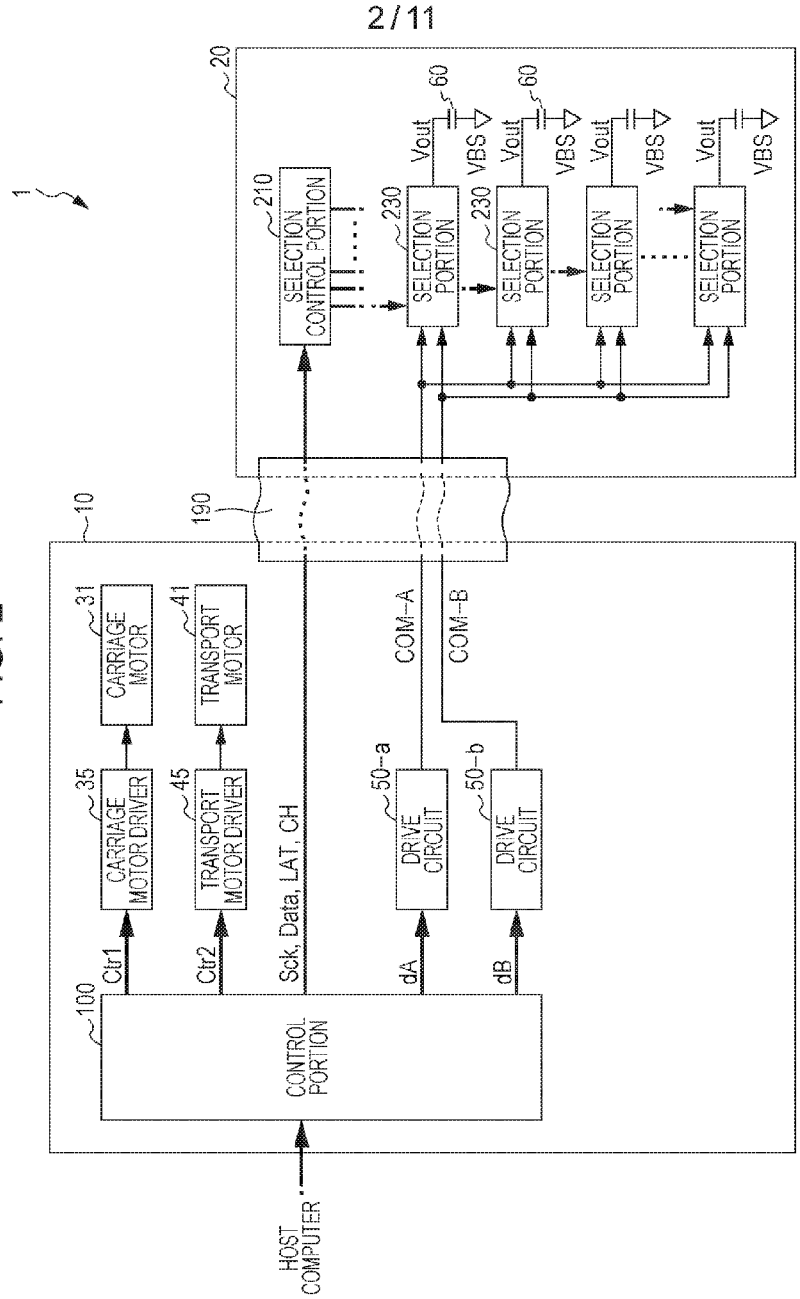
FIG. 2 is a block diagram illustrating the configuration of the liquid discharge apparatus.

FIG. 2 is a block diagram illustrating the electrical configuration of the liquid discharge apparatus 1.

As illustrated in FIG. 2, in the liquid discharge apparatus 1, a control unit 10 and the head unit 20 are connected through the flexible cable 190.

The control unit 10 includes a control portion 100, the carriage motor 31, a carriage motor driver 35, the transport motor 41, a transport motor driver 45, a drive circuit 50-$a$, and a drive circuit 50-$b$. Among these, the control portion 100 outputs various types of control signals in order to control the respective portions, when the image data is supplied from the host computer.

In detail, firstly, the control portion 100 supplies a control signal Ctr1 to the carriage motor driver 35, and the carriage motor driver 35 drives the carriage motor 31 in accordance with the control signal Ctr1. Thereby, the movement of the main scanning direction in the carriage 24 is controlled.

Secondly, the control portion 100 supplies a control signal Ctr2 to the transport motor driver 45, and the transport motor driver 45 drives the transport motor 41 in accordance with the control signal Ctr2. Thereby, the movement of the sub-scanning direction by the transport mechanism 4 is controlled.

Thirdly, the control portion 100 supplies a digital data dA to one drive circuit 50-a of two drive circuits 50-a and 50-b, and supplies a digital data dB to the other drive circuit 50-b. The data dA defines a waveform of a drive signal COM-A, and the data dB defines a waveform of a drive signal COM-B, among the drive signals which are supplied to the head unit 20.

Although the details thereof will be described later, the drive circuit 50-a supplies the drive signal COM-A which is amplified by a Class D amplifier to the head unit 20, after an analog conversion of the data dA. Similarly, the drive circuit 50-b supplies the drive signal COM-B which is amplified by the Class D amplifier to the head unit 20, after the analog conversion of the data dB. Moreover, in the drive circuits 50-a and 50-b, only the data which is input, and the drive signal which is output are different from each other, and circuit configurations thereof are the same as described later. Therefore, when there is no need of particularly differentiating between the drive circuits 50-a and 50-b (for example, in case of describing FIG. 10 described later), "-(hyphen)" will be omitted below, and a sign will be simply described as "50".

Fourthly, the control portion 100 supplies a clock signal Sck, a data signal Data, and control signals LAT and CH to the head unit 20.

In the head unit 20, a plurality of sets of a selection control portion 210, a selection portion 230, and a piezoelectric element (piezo element) 60, are arranged. Furthermore, the head unit 20 may include the drive circuits 50-a and 50-b, as described later.

The selection control portion 210 indicates whether any one of the drive signals COM-A and COM-B is selected with respect to each selection portion 230 (or whether all is non-selected) by the control signal or the like which is supplied from the control portion 100. The selection portion 230 selects the drive signals COM-A and COM-B in accordance with an instruction of the selection control portion 210, and respectively supplies the drive signals COM-A and COM-B to one end of the piezoelectric element 60 as a drive signal. In FIG. 2, a voltage of the drive signal is referred to as Vout. A voltage VBS is commonly applied to the other end in each piezoelectric element 60.

The piezoelectric element 60 is displaced by applying the drive signal. The piezoelectric elements 60 are arranged by correlating with each of the plurality of nozzles in the head unit 20. Therefore, the piezoelectric element 60 discharges the ink by being displaced depending on a difference between the voltage Vout of the drive signal which is selected by the selection portion 230 and the voltage VBS. Next, the configuration of discharging the ink by the driving of the piezoelectric element 60 will be briefly described.

Figure 3:
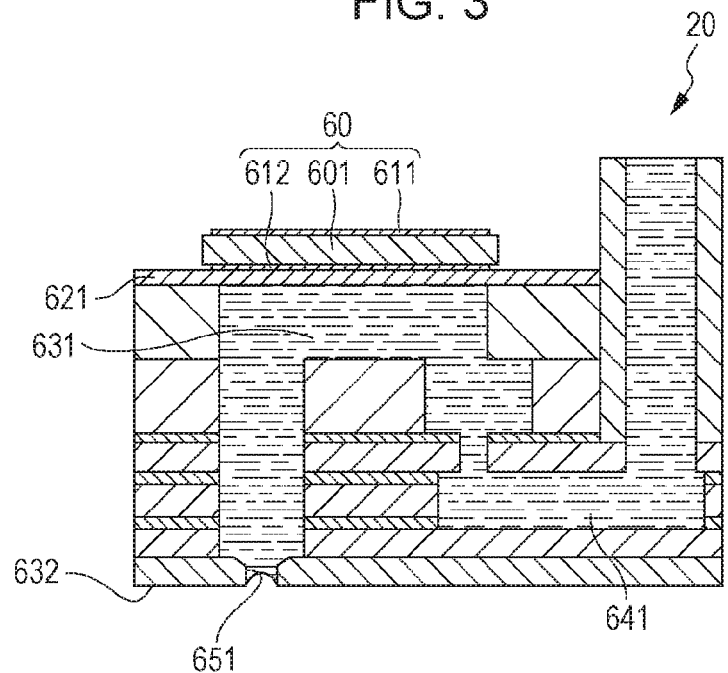
FIG. 3 is a view illustrating a configuration of a discharge portion in a head unit.

FIG. 3 is a view illustrating a schematic configuration of a portion correlating with one of the nozzles in the head unit 20.

As illustrated in FIG. 3, the head unit 20 includes the piezoelectric element 60, a vibration plate 621, a cavity (pressure chamber) 631, a reservoir 641, and a nozzle 651. From among these, the vibration plate 621 is displaced (bendingly vibrated) by the piezoelectric element 60 which is arranged on an upper face in FIG. 3, and functions as a diaphragm that expands and reduces an internal volume of the cavity 631 which is filled with the ink. The nozzle 651 is arranged in a nozzle plate 632, and is an opening portion which communicates with the cavity 631. In the cavity 631, the inner portion thereof is filled with the liquid (for example, the ink), and the internal volume thereof is changed by the displacement of the piezoelectric element 60. The nozzle 651 communicates with the cavity 631, and discharges the liquid of the cavity 631 as a droplet depending on the change in the internal volume of the cavity 631.

The piezoelectric element 60 illustrated in FIG. 3, has a structure of interposing a piezoelectric body 601 between a pair of electrodes 611 and 612. In the piezoelectric body 601 having the structure, the electrodes 611 and 612, the vibration plate 621, and a central portion of FIG. 3, are bent in up and down direction with respect to both end portions depending on the voltage which is applied by the electrodes 611 and 612. Specifically, the piezoelectric element 60 is configured such that if the voltage Vout of the drive signal becomes high, the piezoelectric element 60 is bent upwards, and meanwhile, if the voltage Vout becomes low, the piezoelectric element 60 is bent downwards. In the configuration, if the piezoelectric element 60 is bent upwards, since the internal volume of the cavity 631 is expanded, the ink is drawn from the reservoir 641. Meanwhile, if the piezoelectric element is bent downwards, since the internal volume of the cavity 631 is reduced, the ink is discharged from the nozzle 651 depending on the degree of the reduction.

Furthermore, the piezoelectric element 60 is not limited to the structure illustrated in FIG. 3, and may be a type that can discharge the liquid such as the ink by deforming the piezoelectric element 60. Moreover, the piezoelectric element 60 is not limited to the bending vibration, and may be configured to use a so-called longitudinal vibration.

Additionally, the piezoelectric element 60 is arranged by correlating with the cavity 631 and the nozzle 651 in the head unit 20, and the piezoelectric element 60 is arranged by also correlating with the selection portion 230 in FIG. 1. Therefore, the set of the piezoelectric element 60, the cavity 631, the nozzle 651, and the selection portion 230 is arranged per nozzle 651.

Figure 4A:
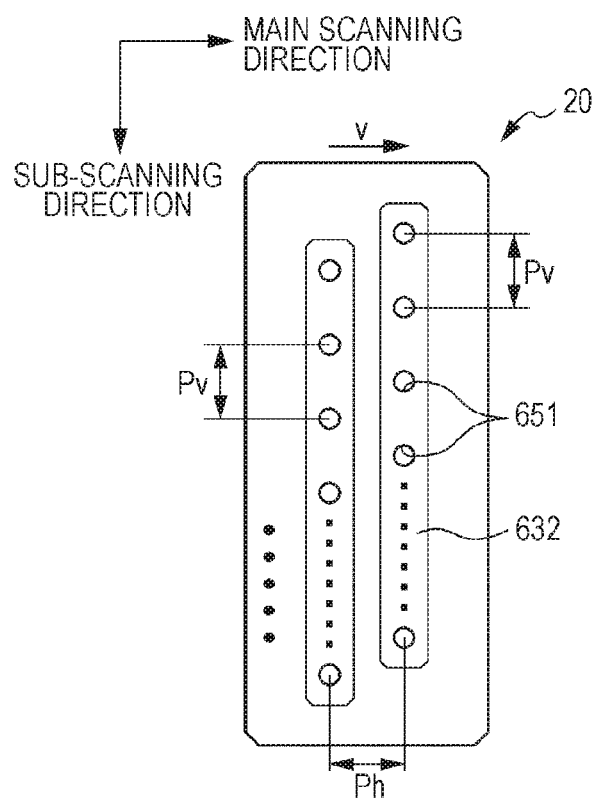
FIG. 4A and FIG. 4B are views illustrating a nozzle array in the head unit.

FIG. 4A is a view illustrating an example of an array of the nozzles 651.

As illustrated in FIG. 4A, the nozzles 651 are arrayed in the following manner, for example, by two lines. Detailedly, when viewed in one line, the plurality of nozzles 651 are arranged at a pitch Pv along the sub-scanning direction. Meanwhile, between two lines, a relationship of being spaced only by a pitch Ph in the main scanning direction, and being shifted only by half of the pitch Pv in the sub-scanning direction is made.

In case of a color printing, for example, the nozzles 651 are arranged along the main scanning direction in a pattern of correlating with the respective colors such as C (cyan), M (magenta), Y (yellow) and K (black), but in the following description, for the simplification, a case of expressing a gradation by a single color will be described.

Figure 4B:
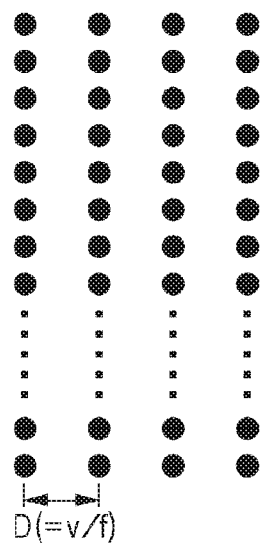

FIG. 4B is a view for describing a basic resolution of an image which is formed by the nozzle array illustrated in FIG. 4A. In order to simplify the description, FIG. 4B is an example of a method (first method) for forming one dot by discharging the ink droplet from the nozzle 651 one time, and illustrates that a black-painted circle sign is a dot which is formed by an impact of the ink droplet.

When the head unit 20 moves at a velocity v in the main scanning direction, a distance D between the dots which are formed by the impacts of the ink droplets (in the main scanning direction), and the velocity v are in the following relationship, as illustrated in FIG. 4B.

That is, when one dot is formed by discharging the ink droplet one time, the dot distance D is a value (=v/f) which is obtained by dividing the velocity v by a discharge frequency f of the ink, in other words, the dot distance D is illustrated by a distance in which the head unit 20 moves in a periodic time (1/f) by repeatedly discharging the ink droplet.

In the examples of FIG. 4A and FIG. 4B, the pitch Ph is in a relationship of being proportional to the dot distance D by a coefficient n, and the ink droplets which are discharged from the nozzles 651 of two lines are impacted on the printing medium P so as to be gathered in the same line. Therefore, as illustrated in FIG. 4B, the distance between the dots in the sub-scanning direction becomes half of the distance between the dots in the main scanning direction. Needless to say, the array of the dots is not limited to the example illustrated in FIG. 4B.

In order to realize the high velocity printing, simply, the velocity v of the head unit 20 which moves in the main scanning direction may be enhanced. However, only by briefly enhancing the velocity v, the distance D between the dots becomes longer. Therefore, in order to realize the high velocity printing after securing the resolution to a certain degree, there is a need to enhance the discharge frequency f of the ink, and to increase the number of dots which are formed per unit time.

Moreover, in order to enhance the resolution separately from a printing velocity, the number of dots which are formed per unit area may be increased. However, in case of increasing the number of dots, not only the dots which are adjacent to each other are combined if the ink is not used in small amount of ink, but also the printing velocity is lowered if the discharge frequency f of the ink is not enhanced.

In this manner, in order to realize the high velocity printing and the high resolution printing, the need to enhance the discharge frequency f of the ink is as described above.

Meanwhile, as a method for forming the dot on the printing medium P, there is a method (second method) for forming one dot by combining the impacted ink droplets of one or more, or a method (third method) for forming the dots of two or more without combining the ink droplets of two or more that may discharge the ink droplet two times or more in a unit term, and impacts the ink droplets of one or more which are discharged in the unit term, in addition to the method for forming one dot by discharging the ink droplet one time. In the following description, a case of forming the dot by the second method will be described.

In the embodiment, the second method will be described by assuming the following example. That is, in the embodiment, by discharging the ink two times at most, one dot is expressed by four gradations of a large dot, a medium dot, a small dot, and a non-recording. In order to express the four gradations, in the embodiment, two types of drive signals COM-A and COM-B are prepared, and respectively have a first half pattern and a second half pattern in one periodic time. In one periodic time, the drive signals COM-A and COM-B are configured to be selected (or not to be selected) depending on the expressed gradation, and to be supplied to the piezoelectric element 60 in the first half and the second half.

Thereupon, the drive signals COM-A and COM-B will be described. Thereafter, the configuration for selecting the drive signals COM-A and COM-B will be described. The drive signals COM-A and COM-B are respectively generated by the drive circuit 50, but for convenience, the drive circuit 50 will be described after the configuration for selecting the drive signals COM-A and COM-B is described.

Figure 5:
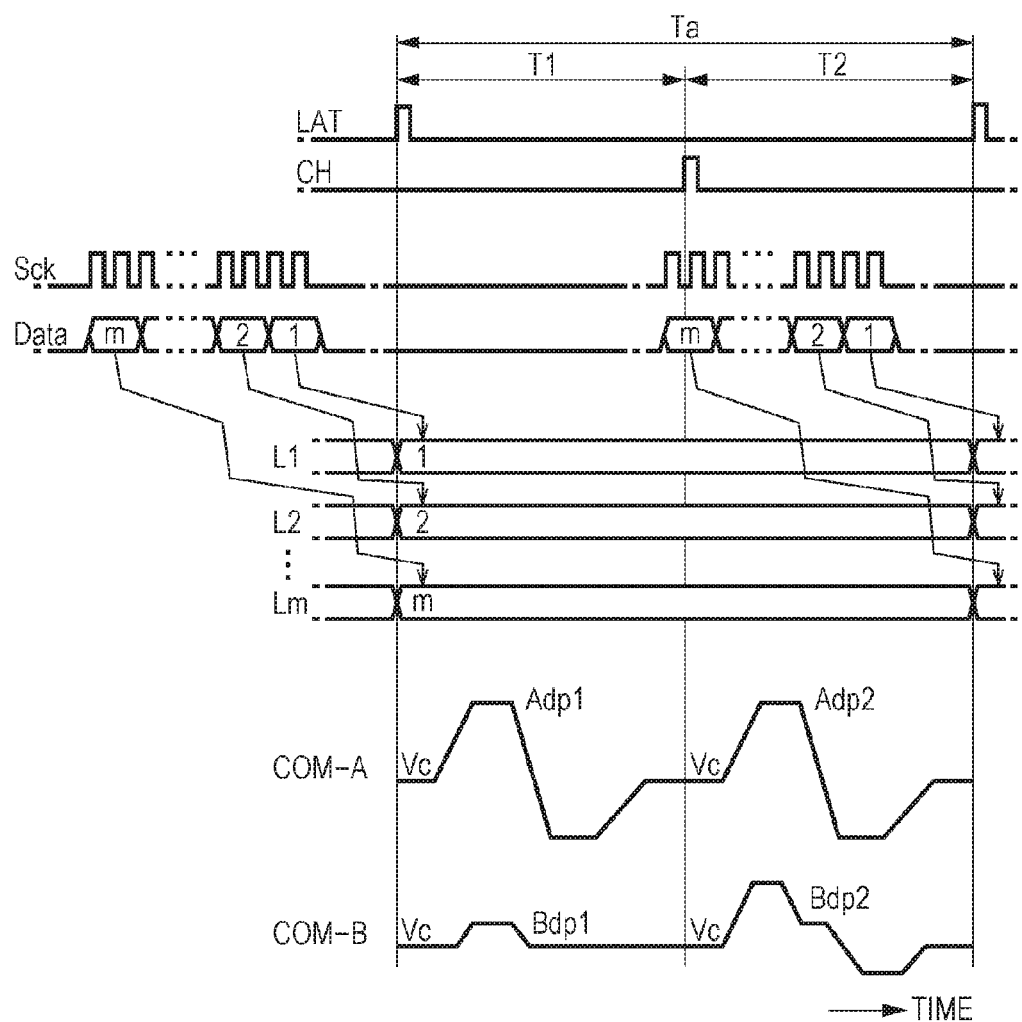
FIG. 5 is a view for describing an operation of a selection control portion in the head unit.

FIG. 5 is a view illustrating the waveforms or the like of the drive signals COM-A and COM-B.

As illustrated in FIG. 5, the drive signal COM-A has a waveform where a trapezoidal waveform Adp1 that is arranged in a term T1 which is from the output (rise) of the control signal LAT until the output of the control signal CH in a periodic time Ta, and a trapezoidal waveform Adp2 that is arranged in a term T2 which is from the output of the control signal CH until the output of the following control signal LAT in the periodic time Ta are continuous.

In the embodiment, the trapezoidal waveforms Adp1 and Adp2 are substantially the same waveforms to each other, and are waveforms of respectively discharging by a predetermined amount, specifically the ink of the amount of the medium degree, from the nozzle 651 correlating with the piezoelectric element 60, if being respectively supplied to one end of the piezoelectric element 60.

The drive signal COM-B has a waveform where a trapezoidal waveform Bdp1 which is arranged in the term T1, and a trapezoidal waveform Bdp2 which is arranged in the term T2 are continuous. In the embodiment, the trapezoidal waveforms Bdp1 and Bdp2 are waveforms which are different from each other. From among these, the trapezoidal waveform Bdp1 is a wave in order to prevent the viscosity of the ink from increasing by minutely vibrating the ink in the vicinity of the opening portion of the nozzle 651. Therefore, even if the trapezoidal waveform Bdp1 is supplied to one end of the piezoelectric element 60, the ink droplet is not discharged from the nozzle 651 correlating with the piezoelectric element 60. Moreover, the trapezoidal waveform Bdp2 becomes a waveform which is different from the trapezoidal waveform Adp1 (Adp2). If being supplied to one end of the piezoelectric element 60, the trapezoidal waveform Bdp2 is a waveform of discharging the ink of the amount which is smaller than the predetermined amount from the nozzle 651 correlating with the piezoelectric element 60.

Furthermore, all of the voltage at the start timing of the trapezoidal waveforms Adp1, Adp2, Bdp1, and Bdp2, and the voltage at the finish timing thereof are common at a voltage Vc. That is, a waveform in which the trapezoidal waveforms Adp1, Adp2, Bdp1, and Bdp2 are respectively started at the voltage Vc, and are finished at the voltage Vc, is made.

Figure 6:
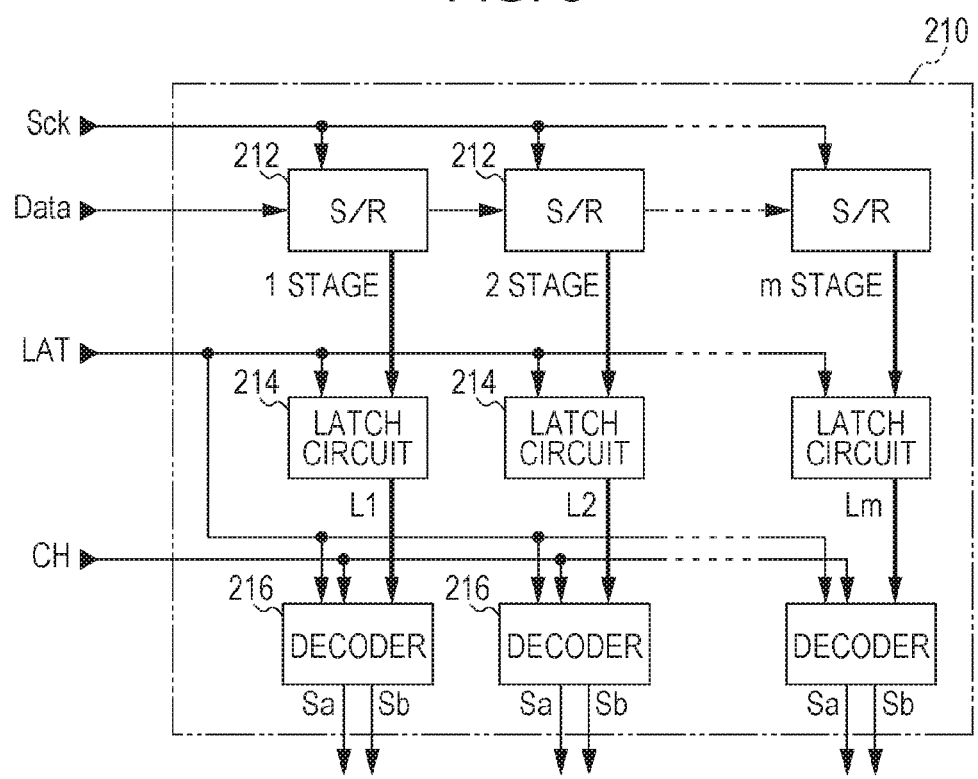
FIG. 6 is a view illustrating a configuration of the selection control portion in the head unit.

FIG. 6 is a view illustrating a configuration of the selection control portion 210 in FIG. 2.

As illustrated in FIG. 6, the clock signal Sck, the data signal Data, and the control signals LAT and CH are supplied to the selection control portion 210 from the control unit 10. In the selection control portion 210, a set of a shift register (S/R) 212, a latch circuit 214, and a decoder 216 is arranged by correlating with each piezoelectric element 60 (nozzle 651).

The data signal Data defines a size of the dot in forming one dot of the image. In the embodiment, in order to express the four gradations of the non-recording, the small dot, the medium dot, and the large dot, the data signal Data is configured by two bits of a most significant bit (MSB) and a least significant bit (LSB).

The data signals Data are supplied in a serial manner from the control portion 100 by matching the main scanning of the head unit 20, per nozzle in synchronization with the clock signal Sck. The shift register 212 is configured to temporarily retain the data signals Data which are supplied in the serial manner, by two bits correlating with the nozzle.

Detailedly, the configuration in which the shift registers 212 of the number of stages correlating with the piezoelectric elements 60 (nozzles) are cascade-connected to each other, and the data signals Data which are supplied in the serial manner are sequentially transmitted to the following stage in accordance with the clock signal Sck, is made.

When the number of piezoelectric elements 60 is m (m is plural number), in order to differentiate the shift register 212, the shift registers 212 are sequentially referred to as 1 stage, 2 stage, . . . , m stage from an upper stream side to which the data signal Data is supplied.

The latch circuit 214 latches the data signal Data which is retained by the shift register 212 at a rise edge of the control signal LAT.

The decoder 216 decodes the data signal Data of two bits which is latched by the latch circuit 214, and outputs selection signals Sa and Sb, and defines the selection of the selection portion 230, per terms T1 and T2 which are defined by the control signal LAT and the control signal CH.

Figures 7, 8:
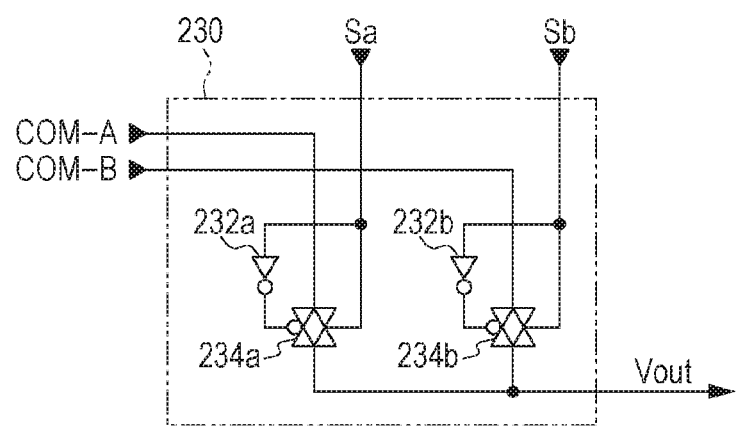
FIG. 7 is a view illustrating a decode content of a decoder in the head unit.
FIG. 8 is a view illustrating a configuration of a selection portion in the head unit.

FIG. 7 is a view illustrating a decode content of the decoder 216.

In FIG. 7, the data signal Data of two bits which is latched, are referred to as (MSB, LSB). In the decoder 216, for example, if the latched data signal Data is (0, 1), it means that logic levels of the selection signals Sa and Sb are respectively output as H level and L level in the term T1, and are respectively output as L level and H level in the term T2.

The logic levels of the selection signals Sa and Sb are level-shifted to the high amplitude logic in comparison with the logic levels of the clock signal Sck, the data signal Data, and the control signals LAT and CH, by a level shifter (not illustrated in FIG. 7).

FIG. 8 is a view illustrating a configuration of the selection portion 230 correlating with one of the piezoelectric elements 60 (nozzles 651) in FIG. 2.

As illustrated in FIG. 8, the selection portion 230 includes inverters (NOT circuits) 232a and 232b, and transfer gates 234a and 234b.

The selection signal Sa from the decoder 216, is supplied to a positive control end to which the circle sign is not attached in the transfer gate 234a. Meanwhile, the selection signal Sa is logically inverted by the inverter 232a, and is supplied a negative control end which to the circle sign is attached in the transfer gate 234a. Similarly, the selection signal Sb is supplied to a positive control end in the transfer gate 234b. Meanwhile, the selection signal Sb is logically inverted by the inverter 232b, and is supplied a negative control end in the transfer gate 234b.

The drive signal COM-A is supplied to an input end of the transfer gate 234a, and the drive signal COM-B is supplied to an input end of the transfer gate 234b. Output ends of the transfer gates 234a and 234b are connected to each other in common, and are connected to one end of the piezoelectric element 60 correlating therewith.

If the selection signal Sa is at H level, the transfer gate 234a makes a conduction (ON) state between the input end and the output end, and if the selection signal Sa is at L level, the transfer gate 234a makes a non-conduction (OFF) state between the input end and the output end. Similarly, the transfer gate 234b makes the ON state or the OFF state between the input end and the output end, depending on the selection signal Sb.

Next, operations of the selection control portion 210 and the selection portion 230 will be described with reference to FIG. 5.

The data signals Data are supplied in the serial manner in synchronization with the clock signal Sck, per nozzle from the control portion 100, and are sequentially transmitted to the shift registers 212 correlating with the nozzles. Therefore, if the control portion 100 stops the supply of the clock signal Sck, the data signals Data correlating with the nozzles is in the state of being retained in each of the shift registers 212. Furthermore, the data signals Data are sequentially supplied by correlating with the nozzles of final m state, . . . , 2 stage, 1 stage in the shift register 222.

Here, if the control signal LAT rises, each of the latch circuits 214 simultaneously latch the data signals Data which are retained in the shift registers 212. In FIG. 5, L1, L2, . . . , Lm illustrate the data signals Data which are latched by the latch circuits 214 correlating with the shift registers 212 of 1 state, 2 stage, . . . , m stage.

The decoder 216 outputs the logic levels of the selection signals Sa and Sb by the contents as illustrated in FIG. 7, in each of the terms T1 and T2, depending on the size of the dot which is defined by the latched data signal Data.

That is, firstly, when the data signal Data is (1, 1), and defines the size of the large dot, the decoder 216 makes the selection signals Sa and Sb into H level and L level in the term T1, and into H level and L level in the term T2. Secondly, when the data signal Data is (0, 1), and defines the size of the medium dot, the decoder 216 makes the selection signals Sa and Sb into H level and L level in the term T1, and into L level and H level in the term T2. Thirdly, when the data signal Data is (1, 0), and defines the size of the small dot, the decoder 216 makes the selection signals Sa and Sb into L level and L level in the term T1, and into L level and H level in the term T2. Fourthly, when the data signal Data is (0, 0), and defines the non-recording, the decoder 216 makes the selection signals Sa and Sb into L level and H level in the term T1, and into L level and L level in the term T2.

Figure 9:
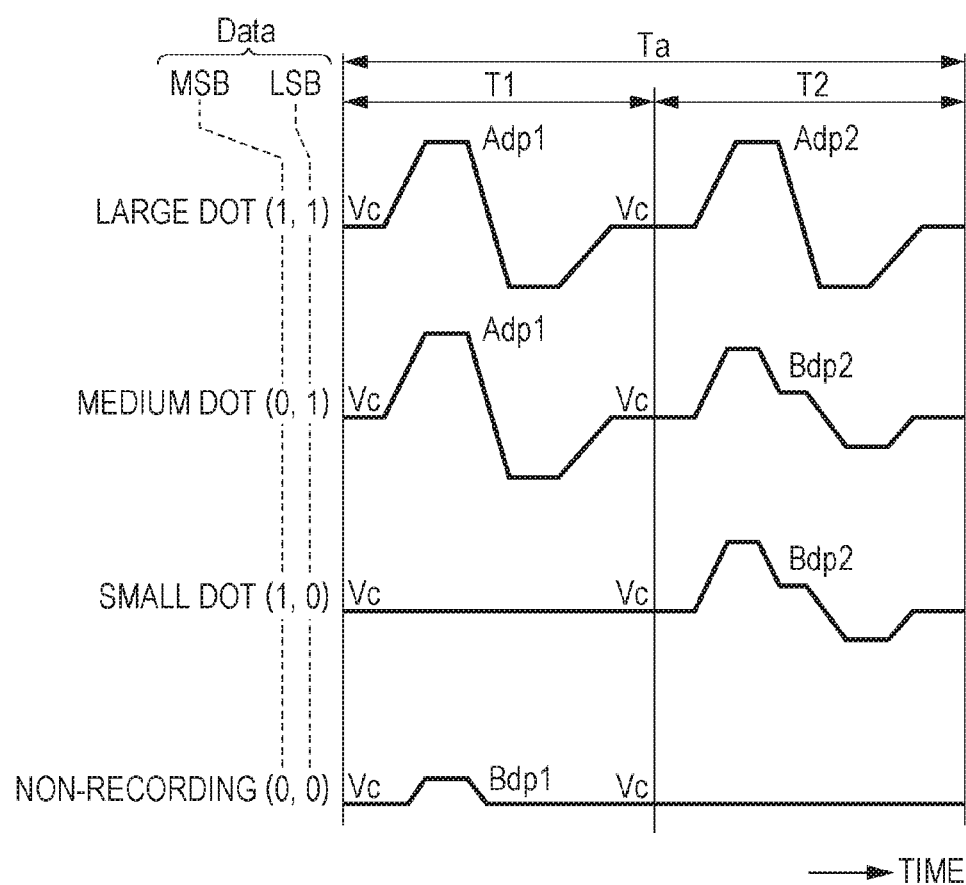
FIG. 9 is a view illustrating a drive signal which is selected by the selection portion.

FIG. 9 is a view illustrating a voltage waveform of the drive signal which is selected depending on the data signal Data, and is supplied to one end of the piezoelectric element 60.

When the data signal Data is (1, 1), since the selection signals Sa and Sb are at H level and L level in the term T1, the transfer gate 234a is turned on, and the transfer gate 234b is turned off. Therefore, the trapezoidal waveform Adp1 of the drive signal COM-A is selected in the term T1. Since the selection signals Sa and Sb are at H level and L level in the term T2, the selection portion 230 selects the trapezoidal waveform Adp2 of the drive signal COM-A.

If the trapezoidal waveform Adp1 is selected in the term T1, and the trapezoidal waveform Adp2 is selected in the term T2, and the trapezoidal waveforms Adp1 and Adp2 are supplied to one end of the piezoelectric element 60 as drive signals in this manner, the inks having the amount of the medium degree are discharged by being divided in two times from the nozzle 651 correlating with the piezoelectric element 60. Therefore, each of the inks are impacted and combined on the printing medium P. As a result, the large dot is formed as defined by the data signal Data.

When the data signal Data is (0, 1), since the selection signals Sa and Sb are at H level and L level in the term T1, the transfer gate 234a is turned on, and the transfer gate 234b is turned off. Therefore, the trapezoidal waveform Adp1 of the drive signal COM-A is selected in the term T1. Next, since the selection signals Sa and Sb are at L level and H level in the term T2, the trapezoidal waveform Bdp2 of the drive signal COM-B is selected.

Accordingly, the ink of the amount of the medium degree, and the ink of the amount of the small degree are discharged by being divided in two times from the nozzle. Therefore, each of the inks are impacted and combined on the printing medium P. As a result, the medium dot is formed as defined by the data signal Data.

When the data signal Data is (1, 0), since the selection signals Sa and Sb are at L level together in the term T1, the transfer gates 234a and 234b are turned off together. Therefore, all of the trapezoidal waveforms Adp1 and Bdp1 are not selected in the term T1. When the transfer gates 234a and 234b are turned off, a path which is from a connection point between the output ends of the transfer gates 234a and 234b to one end of the piezoelectric element 60, is in a high impedance state that is not electrically connected to any portion. However, the piezoelectric element 60 retains a voltage (Vc-VBS) just before the transfer gates 234a and 234b are turned off, by the capacitive properties which the piezoelectric element 60 has.

Next, since the selection signals Sa and Sb are at L level and H level in the term T2, the trapezoidal waveform Bdp2 of the drive signal COM-B is selected. Therefore, since the ink of the amount of the small degree is discharged only in the term T2 from the nozzle 651, the small dot is formed on the printing medium P as defined by the data signal Data.

When the data signal Data is (0, 0), since the selection signals Sa and Sb are at L level and H level in the term T1, the transfer gate 234a is turned off, and the transfer gate 234b is turned on. Therefore, the trapezoidal waveform Bdp1 of the drive signal COM-B is selected in the term T1. Next, since the selection signals Sa and Sb are at L level together in the term T2, all of the trapezoidal waveforms Adp2 and Bdp2 are not selected.

Therefore, since only the ink in the vicinity of the opening portion of the nozzle 651 in the term T1 is minutely vibrated, and the ink is not discharged, resultingly, the dot is not formed. That is, the non-recording is made as defined by the data signal Data.

In this manner, the selection portion 230 selects (or dose not select) the drive signals COM-A and COM-B in accordance with the instruction by the selection control portion 210, and supplies the drive signals COM-A and COM-B to one end of the piezoelectric element 60. Therefore, each piezoelectric element 60 is driven depending on the size of the dot which is defined by the data signal Data.

Furthermore, the drive signals COM-A and COM-B illustrated in FIG. 5, are examples in every point. Actually, the combinations of various waveforms which are prepared in advance are used, depending on the moving velocity of the head unit 20 and the properties of the printing medium P.

Here, the example in which the piezoelectric element 60 is bent upwards along with the rise of the voltage, is described, but if the voltage which is supplied to the electrodes 611 and 612 is reversed, the piezoelectric element 60 is bent downwards along with the rise of the voltage. Therefore, the drive signals COM-A and COM-B illustrated in FIG. 9, have waveforms which are inverted on the basis of the voltage Vc in the configuration in which the piezoelectric element 60 is bent downwards along with the rise of the voltage.

In the embodiment, one dot is formed onto the printing medium P by using the periodic time Ta being the unit term as a unit in this manner. Therefore, in the embodiment of forming one dot by discharging the ink droplets two times (at most) in the periodic time Ta, the discharge frequency f of the ink becomes 2/Ta, and the dot distance D is a value that is obtained by dividing the velocity v which the head unit 20 moves by the discharge frequency f (=2/Ta) of the ink.

In general, the ink droplets may be discharged Q (Q is an integer of two or more) times in a unit term T, and when one dot is formed by discharging the ink droplets Q times, the discharge frequency f of the ink may be expressed by Q/T.

As the embodiment, even if the time (periodic time) which is necessary for forming one dot is the same in a case of forming the dots of the different sizes onto the printing medium P, in comparison with a case of forming one dot by discharging the ink droplets one time, there is a need to shorten the time for discharging the one-time ink droplets one time.

Furthermore, there is no need for a special description regarding the third method for forming the dots of two or more without combining the ink droplets of two or more.

2. Circuit Configuration of Drive Circuit

Subsequently, the drive circuits 50-a and 50-b will be described. From among these, if one drive circuit 50-a is schematically described, the drive signal COM-A is generated in the following manner. That is, in the drive circuit 50-a, firstly, the analog conversion of the data dA which is supplied from the control portion 100 is performed. Secondly, the output drive signal COM-A is fed back, and a deviation between a signal (attenuated signal) based on the drive signal COM-A and a target signal is corrected by a high frequency component of the drive signal COM-A, and a modulation signal is generated in accordance with the corrected signal. Thirdly, an amplified modulation signal is generated by switching the transistor in accordance with the modulation signal. Fourthly, the amplified modulation signal is smoothed (demodulated) by a low-pass filter, and the smoothed signal is output as a drive signal COM-A.

The other drive circuit 50-b is similarly configured, and only a point of outputting the drive signal COM-B from the data dB is different. In the following FIG. 10, since the drive circuits 50-a and 50-b are not differentiated, the drive circuits 50-a and 50-b will be described as a drive circuit 50.

However, the input data and the output drive signals are referred to as dA (dB), COM-A (COM-B) or the like. It is expressed that in case of the drive circuit 50-a, the drive signal COM-A is output by inputting the data dA, and in case of the drive circuit 50-b, the drive signal COM-B is output by inputting the data dB.

Figure 10:
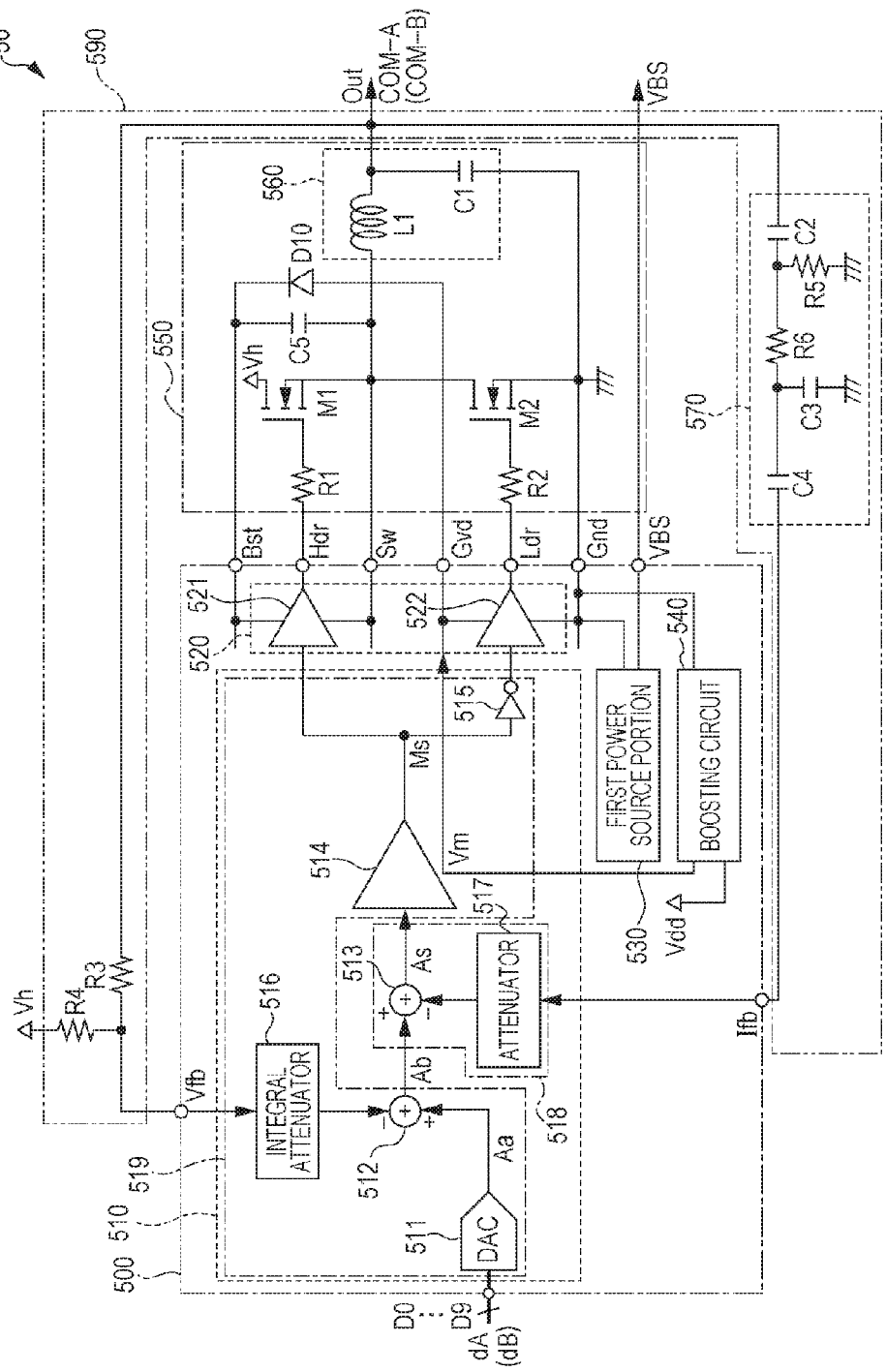
FIG. 10 is a view illustrating a circuit configuration of a drive circuit (capacitive load drive circuit).

FIG. 10 is a view illustrating a circuit configuration of the drive circuit (capacitive load drive circuit) 50.

In FIG. 10, a configuration for outputting the drive signal COM-A is illustrated, but actually, in an integrated circuit device 500, a circuit for generating both of the drive signals COM-A and COM-B of dual system is packaged into one.

As illustrated in FIG. 10, the drive circuit 50 is configured from the integrated circuit device (integrated circuit device for capacitive load drive) 500, and various types of elements such as a resistor and a capacitor, in addition to an output circuit 550.

In the embodiment, the drive circuit 50 includes a modulation portion 510 that generates the modulation signal by pulse-modulating a source signal, a transistor (first transistor M1 and second transistor M2) that generates an amplified modulation signal which is obtained by amplifying the modulation signal, a low-pass filter 560 that generates the drive signal by demodulating the amplified modulation signal, a feedback circuit 590 that generates a feedback signal on the basis of the drive signal, and feeds back the feedback signal to the modulation portion 510, and a feedback terminal Ifb that electrically connects the modulation portion 510 and the feedback circuit 590.

In the embodiment, the integrated circuit device 500 includes the modulation portion 510, a gate driver 520 that generates an amplified control signal on the basis of the modulation signal, and the feedback terminal Ifb.

The integrated circuit device 500 outputs the gate signal (amplified control signal) to each of the first transistor M1 and the second transistor M2, on the basis of the data dA (source signal) of ten bits which is input through a terminal D0 to a terminal D9 from the control portion 100. Therefore, the integrated circuit device 500 includes the modulation portion 510, a first gate driver 521, a second gate driver 522, a first power source portion 530, and a boosting circuit 540. The modulation portion 510 includes a digital to analog converter (DAC) 511, an adder 512, an adder 513, a comparator 514, an inverter 515, an integral attenuator 516, and an attenuator 517 (signal level conversion portion).

The DAC 511 converts the data dA which defines the waveform of the drive signal COM-A into an analog signal Aa, and supplies the analog signal Aa to an input end (+) of the adder 512. For example, a voltage amplitude of the analog signal Aa is approximately 0 volt to 2 volts, and the drive signal COM-A is a value that is obtained by amplifying the voltage in approximately 20 times. That is, the analog signal Aa is a signal which becomes the target before the amplification of the drive signal COM-A.

The integral attenuator 516 attenuates and integrates the voltage of a terminal Out which is input through the feedback circuit 590 and a feedback terminal Vfb, namely, the drive signal COM-A, and supplies the obtained value to an input end (−) of the adder 512.

The adder 512 supplies the signal Ab of the voltage which is integrated by subtracting the voltage of the input end (−) from the voltage of the input end (+), to the input end (+) of the adder 513.

Furthermore, a power source voltage of the circuit which leads to the inverter 515 from the DAC 511, is a low amplitude (voltage Vdd) of 3.3 volts. Therefore, since the voltage of the drive signal COM-A may exceed 40 volts at most while the voltage of the analog signal Aa is 2 volts at most, the voltage of the drive signal COM-A is attenuated by the integral attenuator 516 in order to adjust the amplitude ranges of both voltages in the calculation of the deviation.

The attenuator 517 (signal level conversion portion) attenuates the high frequency component of the drive signal COM-A which is input through the feedback circuit 590 and the feedback terminal Ifb, and supplies the obtained value to the input end (−) of the adder 513. The adder 513 supplies the signal As of the voltage which is obtained by subtracting the voltage of the input end (−) from the voltage of the input end (+), to the comparator 514. The attenuation by the attenuator 517, is for the adjustment of the amplitudes in the feedback of the drive signal COM-A, in the same manner as the integral attenuator 516.

The voltage of the signal As which is output from the adder 513, is a voltage that is obtained by subtracting the attenuated voltage of the signal which is supplied to the feedback terminal Vfb from the voltage of the analog signal Aa, and subtracting the attenuated voltage of the signal which is supplied to the feedback terminal Ifb. Therefore, the voltage of the signal As by the adder 513, may be referred to as a signal in which the deviation that is obtained by subtracting the attenuated voltage of the drive signal COM-A which is output from the terminal Out from the voltage of the analog signal Aa being the target, is corrected by the high frequency component of the drive signal COM-A.

The comparator 514 outputs a modulation signal Ms which is pulse-modulated in the following manner, on the basis of the attenuated voltage by the adder 513. Detailedly, the comparator 514 outputs the modulation signal Ms in which if the signal As which is output from the adder 513 is at the time of the voltage rise, the modulation signal Ms is at H level when being equal to or more than a voltage threshold Vth1, and if the signal As is at the time of the voltage fall, the modulation signal Ms is at L level when being less than a voltage threshold Vth2. As described later, the voltage thresholds are set to a relationship of Vth1>Vth2.

The modulation signal Ms by the comparator 514, is supplied to the second gate driver 522 through the logic inversion by the inverter 515. On the other hand, the modulation signal Ms is supplied to the first gate driver 521, without passing through the logic inversion. Therefore, the logic levels which are supplied to the first gate driver 521 to the second gate driver 522, is in a relationship of being exclusive to each other.

Actually, the timing may be controlled so that the logic levels which are supplied to the first gate driver 521 and the second gate driver 522 are not at H level at the same time (the first transistor M1 and the second transistor M2 are not turned on at the same time). Therefore, strictly speaking, a term of being exclusive which is referred herein, means that the logic levels are not at H level at the same time (the first transistor M1 and the second transistor M2 are not turned on at the same time).

Here, the modulation signal is the modulation signal Ms in a narrow sense, but considering the signal which is pulse-modulated depending on the analog signal Aa, a negative signal of the modulation signal Ms is also included in the modulation signal. That is, not only the modulation signal Ms but also the signal which obtained by inverting the logic level of the modulation signal Ms or the signal of which the timing is controlled, are included in the modulation signal which is pulse-modulated depending on the analog signal Aa.

Since the comparator 514 outputs the modulation signal Ms, the circuits which leads to the comparator 514 or the inverter 515, namely, the DAC 511, the adder 512, the adder 513, the comparator 514, the inverter 515, the integral attenuator 516, and the attenuator 517 correlate with the modulation portion 510 which generates the modulation signal.

In the configuration illustrated in FIG. 10, the digital data dA is converted into the analog signal Aa by the DAC 511, but for example, the analog signal Aa may be supplied from an external circuit in accordance with the instruction by the control portion 100 without passing through the DAC 511. Since a target value in generating the waveform of the drive signal COM-A is defined even if the digital data dA is made or even if the analog signal Aa is made, it is not changed to be the source signal.

In the first gate driver 521, a low logic amplitude being the output signal of the comparator 514 is level-shifted into a high logic amplitude, and is output from a terminal Hdr. Among the power source voltages of the first gate driver 521, a high-level side is a voltage which is applied through a terminal Bst, and a low-level side is a voltage which is applied through a terminal Sw. The terminal Sw is connected to a source electrode of the first transistor M1, a drain electrode of the second transistor M2, the other end of the capacitor C5, and one end of an inductor L1.

The second gate driver 522 is operated on a low potential side in comparison with the first gate driver 521. In the second gate driver 522, the low logic amplitude (L level: 0 volt, H level: 3.3 volts) being the output signal of the inverter 515 is level-shifted into the high logic amplitude (for example, L level: 0 volt, H level: 7.5 volts), and is output from a terminal Ldr. Among the power source voltages of the second gate driver 522, a voltage Vm (for example, 7.5 volts) is applied to the high-level side, and zero voltage is applied to the low-level side through a ground terminal Gnd. That is, the ground terminal Gnd is grounded to the ground. Moreover, a terminal Gvd is connected to an anode electrode of a diode D10 for preventing a back flow, and a cathode electrode of the diode D10 is connected to one end of a capacitor C5 and the terminal Bst.

For example, the first transistor M1 and the second transistor M2 are N-channel type field effect transistors (FETs). From among these, in the first transistor M1 of the high side, a voltage Vh (for example, 42 volts) is applied to the drain electrode, and the gate electrode is connected to a terminal Hdr through a resistor R1. In the second transistor M2 of the low side, the gate electrode is connected to a terminal Ldr through a resistor R2, and the source electrode is grounded to the ground.

The other end of the inductor L1 is the terminal Out which is output by the drive circuit 50, and the drive signal COM-A from the terminal Out is supplied to the head unit 20 through the flexible cable 190 (see FIG. 1 and FIG. 2).

The terminal Out is connected to each of one end of a capacitor C1, one end of a capacitor C2, and one end of a resistor R3. From among these, the other end of the capacitor C1 is grounded to the ground. Therefore, the inductor L1 and the capacitor C1 function as a low-pass filter (Low Pass Filter) that smoothes the amplified modulation signal which appears at the connection point of the first transistor M1 and the second transistor M2.

The other end of the resistor R3 is connected to the feedback terminal Vfb and one end of and a resistor R4, and the voltage Vh is applied to the other end of the resistor R4. Thereby, to the feedback terminal Vfb, the drive signal COM-A from the terminal Out is fed back by being pulled up.

Meanwhile, the other end of the capacitor C2 is connected to one end of a resistor R5 and one end of a resistor R6. From among these, the other end of the resistor R5 is grounded to the ground. Therefore, the capacitor C2 and the resistor R5 function as a high-pass filter (High Pass Filter) that passes the high frequency component which is equal to or more than a cut-off frequency, among the drive signals COM-A from the terminal Out. Furthermore, for example, the cut-off frequency of the high-pass filter is set to approximately 9 MHz.

Moreover, the other end of the resistor R6 is connected to one end of the capacitor C4 and one end of the capacitor C3. From among these, the other end of the capacitor C3 is grounded to the ground. Therefore, the resistor R6 and the capacitor C3 function as a low-pass filter (Low Pass Filter) that passes the low frequency component which is equal to or less than the cut-off frequency, among the signal components passing through the high-pass filter. For example, the cut-off frequency of the low-pass filter is set to approximately 160 MHz.

Since the cut-off frequency of the high-pass filter is set to be lower than the cut-off frequency of the low-pass filter, the high-pass filter and the low-pass filter function as a band-pass filter (Band Pass Filter) 570 that passes the high frequency component of a predetermined frequency range, among the drive signals COM-A.

The other end of the capacitor C4 is connected to the feedback terminal Ifb of the integrated circuit device 500. Thereby, to the feedback terminal Ifb, a DC component is fed back by being cut, among the high frequency components of the drive signals COM-A passing through the band pass filter 570.

Incidentally, the drive signal COM-A which is output from the terminal Out, is a signal that is obtained by smoothing the amplified modulation signal by the low-pass filter which is made up of the inductor L1 and the capacitor C1, at the connection point (terminal Sw) of the first transistor M1 and the second transistor M2. Since the drive signal COM-A is positively fed back to the adder 512 after being integrated and subtracted through the feedback terminal Vfb, a self-oscillation is performed at a frequency which is determined by a delay of the feedback (sum of delay by the smoothing of the inductors L1 and the capacitor C1, and delay by the integral attenuator 516), and a transfer function of the feedback.

However, since a delay amount of a feedback path through the feedback terminal Vfb is large, only the feedback through the feedback terminal Vfb may not make the frequency of the self-oscillation higher as the accuracy of the drive signal COM-A may be sufficiently secured.

In the embodiment, separately from the path through the feedback terminal Vfb, by arranging a path of feeding back the high frequency component of the drive signal COM-A through the feedback terminal Ifb, the delay when viewed in the whole of the circuits is made to be smaller. That is, in the embodiment, the feedback circuit 590 feeds back a signal of a high frequency band of the drive signal as a feedback signal. Therefore, the frequency of the signal As which is obtained by adding the high frequency component of the drive signal COM-A to the signal Ab, becomes high as the accuracy of the drive signal COM-A may be sufficiently secured in comparison with a case where the path through the feedback terminal Ifb is not present.

Figure 11:
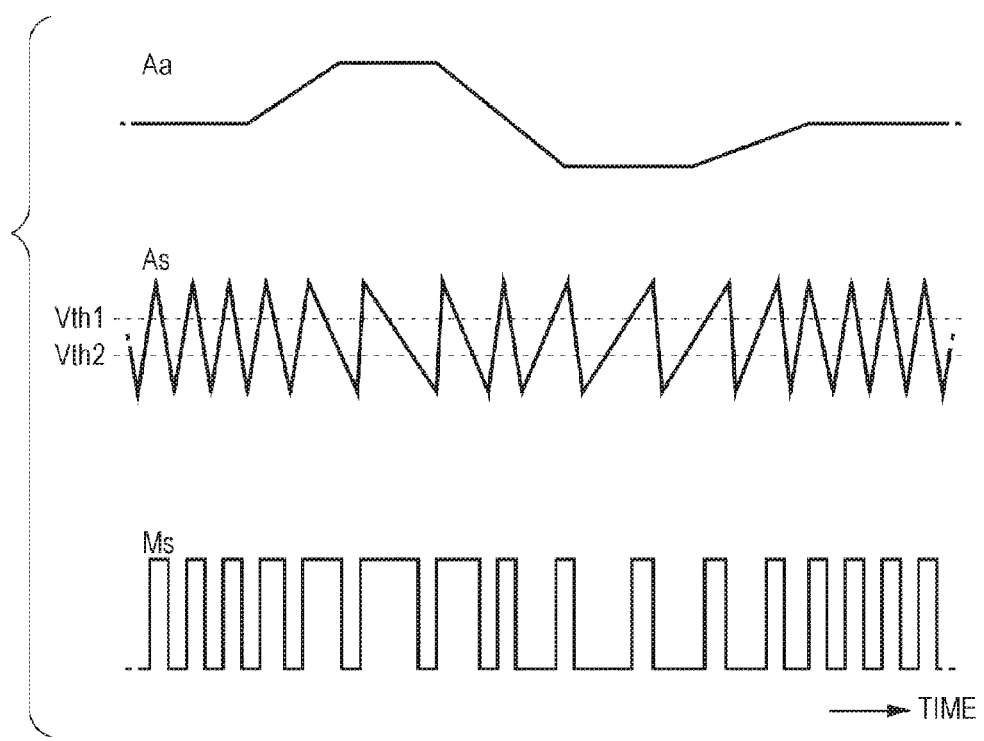
FIG. 11 is a view for describing an operation of the drive circuit.

FIG. 11 is a view illustrating the waveforms of the signal As and the modulation signal Ms in association with the waveform of the analog signal Aa.

As illustrated in FIG. 11, the signal As is a triangular wave, and an oscillation frequency thereof is changed depending on the voltage (input voltage) of the analog signal Aa. Specifically, the oscillation frequency is highest when the input voltage is an intermediate value, and the oscillation frequency becomes lower as the input voltage becomes higher from the intermediate value, or be lower.

Moreover, if the input voltage is in the vicinity of the intermediate value, the inclinations of the triangular wave in the signal As are substantially equal in an ascent (rise of the voltage) and a descent (fall of the voltage). Therefore, s duty ratio of the modulation signal Ms being a result which is obtained by comparing the signal As with the voltage thresholds Vth1 and Vth2 by the comparator 514, is substantially 50%. If the input voltage becomes higher from the intermediate value, the inclination of the descent of the signal As becomes gentle. Therefore, the term in which the modulation signal Ms is at H level becomes relatively long, and the duty ratio becomes large. On the other hand, as the input voltage becomes lower from the intermediate value, the inclination of the ascent of the signal As becomes gentle.

Therefore, the term in which the modulation signal Ms is at H level becomes relatively short, and the duty ratio becomes small.

Therefore, the modulation signal Ms is a pulse density modulation signal as follows. That is, the duty ratio of the modulation signal Ms, is substantially 50% at the intermediate value of the input voltage, and becomes large as the input voltage becomes higher than the intermediate value, and becomes small as the input voltage becomes lower than the intermediate value.

The first gate driver 521 turns on or off the first transistor M1 on the basis of the modulation signal Ms. That is, the first gate driver 521 turns on the first transistor M1 if the modulation signal Ms is at H level, and turns off the first transistor M1 if the modulation signal Ms is at L level. The second gate driver 522 turns on or off the second transistor M2 on the basis of a logic inversion signal of the modulation signal Ms. That is, the second gate driver 522 turns off the second transistor M2 if the modulation signal Ms is at H level, and turns on the second transistor M2 if the modulation signal Ms is at L level.

Accordingly, since the voltage of the drive signal COM-A which is obtained by smoothing the amplified modulation signal by the inductor L1 and the capacitor C1 at the connection point of the first transistor M1 and the second transistor M2, becomes higher as the duty ratio of the modulation signal Ms becomes large, and becomes lower as the duty ratio becomes small, resultingly, the drive signal COM-A is controlled to be a signal that is obtained by enlarging the voltage of the analog signal Aa, and is output.

Since the drive circuit 50 uses the pulse density modulation, there is an advantage that the modulation frequency may make a change width of the duty ratio larger in comparison with the modulation of a fixed pulse width.

That is, since the minimum positive pulse width and the minimum negative pulse width which may be handled by the whole of the circuits are limited by the circuit characteristics, a predetermined range (for example, a range which is from 10% to 90%) may be merely secured as a change width of the duty ratio, in the modulation of the fixed pulse width of the frequency. In contrast, in the pulse density modulation, since the oscillation frequency becomes low as the input voltage is separated from the intermediate value, the duty ratio may be made to be larger in a region where the input voltage is high, and the duty ratio may be made to be smaller in a region where the input voltage is low. Therefore, in the self-oscillating type pulse density modulation, a wider range (for example, a range which is from 5% to 95%) may be secured as a change range of the duty ratio.

Moreover, in the drive circuit 50, there is no need for a circuit which generates a carrier wave of the high frequency as the self-oscillation or the separately-excited oscillation. Therefore, there is an advantage that the integration of the portion other than the circuit which handles with the high voltage, namely, the integrated circuit device 500 is easy.

Additionally, in the drive circuit 50, since not only the path through the feedback terminal Vfb but also the path of feeding back the high frequency component through the feedback terminal Ifb are used as a feedback path of the drive signal COM-A, the delay when viewed in the whole of the circuits becomes small. Therefore, since the frequency of the self-oscillation becomes higher, the drive circuit 50 may be capable of accurately generating the drive signal COM-A.

In the embodiment, the oscillation frequency of the modulation signal may be 1 MHz or higher to 8 MHz or lower.

In the liquid discharge apparatus 1 described above, the drive signal is generated by smoothing the amplified modulation signal, and the piezoelectric element 60 is displaced by applying the drive signal, and the liquid is discharged from the nozzle 651. Here, for example, if the liquid discharge apparatus 1 performs a frequency spectrum analysis of the waveform of the drive signal for discharging the small dot, it is confirmed that the frequency component of 50 kHz or higher is included. In order to generate the drive signal including the frequency component of 50 kHz or higher in this manner, there is a need that the frequency of the modulation signal (frequency of the self-oscillation) is 1 MHz or higher.

If the frequency is lower than 1 MHz, an edge of the waveform of the drive signal which is reproduced becomes dull and round. In other words, the waveform becomes dull by that an angle is softened. If the waveform of the drive signal is dull, the displacement of the piezoelectric element 60 which is operated depending on a rise edge and a fall edge of the waveform becomes gentle, and a tailing at the time of the discharging, a discharge failure or the like is generated, and the quality of the printing is lowered.

On the other hand, if the frequency of the self-oscillation is higher than 8 MHz, the resolving power of the waveform of the drive signal increases. However, since a switching frequency is climbed in the transistor, a switching loss becomes large, and the power saving properties and the heating saving properties which have predominance in comparison with a linear amplification such as a Class AB amplifier, are damaged.

Therefore, in the liquid discharge apparatus 1, the head unit 20, the integrated circuit device 500, and the drive circuit 50 described above, the frequency of the modulation signal is preferably 1 MHz or higher to 8 MHz or lower.

Referring back to FIG. 10, in the example illustrated in FIG. 10, the resistor R1, the resistor R2, the first transistor M1, the second transistor M2, the capacitor C5, the diode D10 and the low-pass filter 560 are configured as an output circuit 550 that generates the amplified control signal on basis of the modulation signal, and outputs the drive signal to the capacitive load (piezoelectric element 60) by generating the drive signal on basis of the amplified control signal.

The first power source portion 530 applies the signal to the terminal that is different from the terminal to which the drive signal of the piezoelectric element 60 is applied. For example, the first power source portion 530 is configured by a constant voltage circuit such as a bandgap reference circuit. The first power source portion 530 outputs the voltage VBS from the terminal VBS. In the example illustrated in FIG. 10, the first power source portion 530 generates the voltage VBS on the basis of the ground potential of the ground terminal Gnd.

The boosting circuit 540 supplies to the power source to the gate driver 520. The boosting circuit 540 may be configured by a charge pump circuit, a switching regulator circuit or the like. In the example illustrated in FIG. 10, the boosting circuit 540 generates the voltage Vm which becomes the power source voltage on the high potential side of the second gate driver 522. Moreover, the boosting circuit 540 generates the voltage Vm by boosting the voltage Vdd on the basis of the ground potential of the ground terminal Gnd.

In the embodiment, the gate driver 520, the first power source portion 530, and the boosting circuit 540 are connected to the ground terminal Gnd in common. Furthermore, the gate driver 520, the first power source portion 530, and the boosting circuit 540 may be connected to the ground terminals which are independent from each other.

In the embodiment, the boosting circuit 540 may be a charge pump circuit. According to the embodiment, the generation of the noise can be suppressed, in comparison with the case of using the switching regulator circuit as a boosting circuit 540. Consequently, since the voltage which is applied to the piezoelectric element 60 can be controlled with high accuracy, the liquid discharge apparatus 1, the head unit 20, the integrated circuit device 500, and the drive circuit 50 that can improve the discharge accuracy of the liquid, can be realized.

In the embodiment, the modulation portion 510 includes a first circuit block 518 including the adder 513 which is on the signal path from the feedback terminal Ifb to the output of the modulation portion 510, and a second circuit block 519 including at least a portion of a circuit which is different from the adder 513 of the modulation portion 510.

In the embodiment, the first circuit block 518 includes the adder 513, and the attenuator 517 (signal level conversion portion). The second circuit block 519 includes the DAC 511, the adder 512, the comparator 514, the inverter 515, and the integral attenuator 516.

3. Layout Configuration of Integrated Circuit Device

Figure 12:
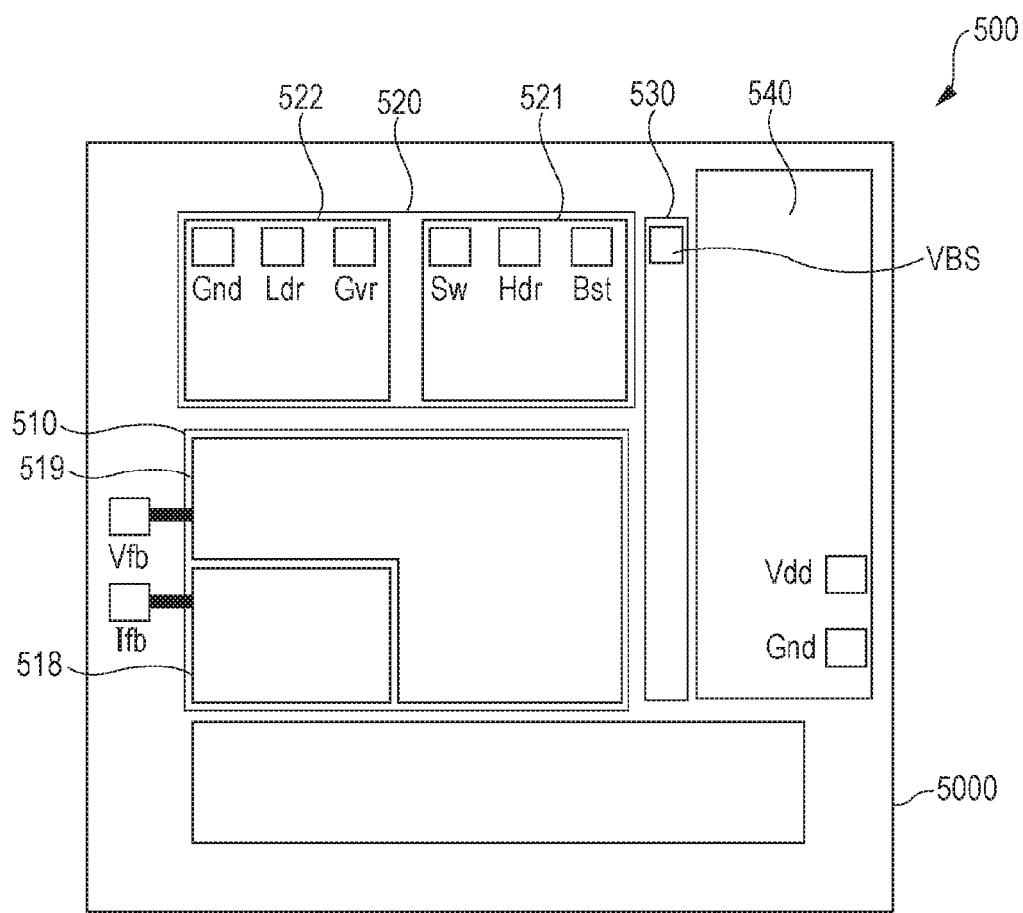
FIG. 12 is a plan view schematically illustrating an example of a layout configuration of an integrated circuit device.

FIG. 12 is a plan view schematically illustrating an example of a layout configuration of the integrated circuit device 500. In FIG. 12, only a main portion of each terminal illustrated in FIG. 10, is illustrated.

In the example illustrated in FIG. 12, the first circuit block 518 and the second circuit block 519 of the modulation portion 510, are formed on the same semiconductor substrate 5000. Hereinafter, a case where the semiconductor substrate 5000 is a P-type will be described as an example.

Figure 13A:
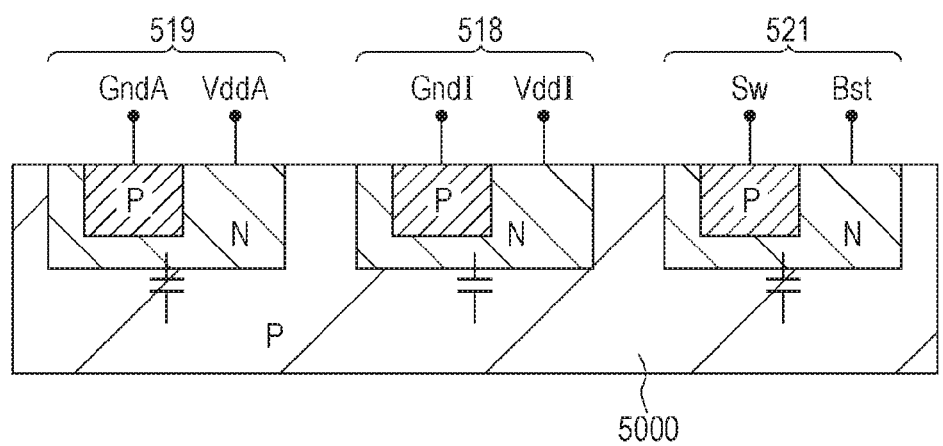
FIG. 13A is a sectional view conceptually illustrating a structure of the integrated circuit device.
Figure 13B:
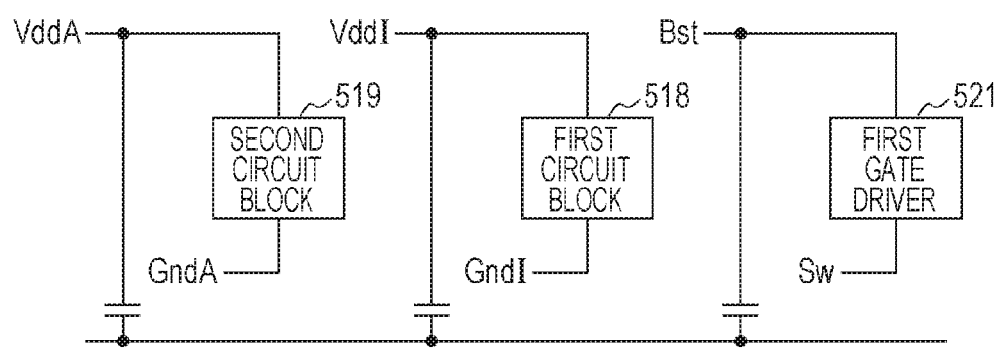
FIG. 13B is a circuit diagram conceptually illustrating the integrated circuit device.

FIG. 13A is a sectional view conceptually illustrating a structure of the integrated circuit device 500, and FIG. 13B is a circuit diagram conceptually illustrating the integrated circuit device 500.

In the example illustrated in FIG. 13A, the first circuit block 518, the second circuit block 519, and the first gate driver 521 are configured to be separated by a triple-well structure where an N-type well is formed in the P-type semiconductor substrate 5000, and a P-type well is formed in the N-type well.

A potential VddI on the high potential side of the first circuit block 518 is supplied to the N-type well, and a potential GndI on the low potential side is supplied to the P-type well. A potential VddA on the high potential side of the second circuit block 519 is supplied to the N-type well, and a potential GndA on the low potential side is supplied to the P-type well. A potential Bst on the high potential side of the first gate driver 521 is supplied to the N-type well, and a potential Sw on the low potential side is supplied to the P-type well.

As illustrated in FIG. 13A and FIG. 13B, the capacitive coupling of a depletion layer is performed into a dielectric body in an alternating current manner between the P-type semiconductor substrate 5000 and the N-type well. Therefore, for example, the noise which is generated at the potential Bst being the potential on the high potential side of the first gate driver 521, has an influence on VddI being the potential on the high potential side of the first circuit block 518, and VddA being the potential on the high potential side of the second circuit block 519 through the semiconductor substrate 5000.

According to the embodiment, by separating the adder 513 which is likely to be affected by the noise from other circuits by the triple-well structure, it is possible to make the parasitic capacitance of the first circuit block 518 including the adder 513 smaller. Thereby, since it is possible to suppress that the noises which are generated by other circuit blocks (for example, gate driver 520) go around the adder 513, the modulation portion 510 can generate the accurate modulation signal. Therefore, since it is possible to control the voltage which is applied to the piezoelectric element 60 with high accuracy, it is possible to realize the liquid discharge apparatus 1, the head unit 20, the drive circuit 50, and the integrated circuit device 500 that can improve the discharge accuracy of the liquid.

As described above, the first circuit block may further include the signal level conversion portion (attenuator 517) that converts the level of the feedback signal.

According to the embodiment, by separating the adder 513 which is likely to be affected by the noise and the signal level conversion portion (attenuator 517) from other circuits by the triple-well structure, it is possible to make the parasitic capacitance of the first circuit block 518 including the adder 513 and the signal level conversion portion (attenuator 517) smaller. Thereby, since it is possible to suppress that the noises which are generated by other circuit blocks (for example, gate driver 520) go around the adder 513, the modulation portion 510 can generate the accurate modulation signal. Therefore, since it is possible to control the voltage which is applied to the piezoelectric element 60 with high accuracy, it is possible to realize the liquid discharge apparatus 1, the head unit 20, the drive circuit 50, and the integrated circuit device 500 that can improve the discharge accuracy of the liquid.

As illustrated in FIG. 12, in the embodiment, an area of the well where the first circuit block 518 is formed, may be smaller than an area of the well where the second circuit block 519 is formed in a planar view.

According to the embodiment, it is possible to make the parasitic capacitance of the first circuit block 518 including the adder 513 smaller. Thereby, since it is possible to suppress that the noises which are generated by other circuit blocks (for example, gate driver 520) go around the adder 513, the modulation portion 510 can generate the accurate modulation signal. Therefore, since it is possible to control the voltage which is applied to the piezoelectric element 60 with high accuracy, it is possible to realize the liquid discharge apparatus 1, the head unit 20, the drive circuit 50, and the integrated circuit device 500 that can improve the discharge accuracy of the liquid.

Hitherto, the embodiments or modification examples are described, but the invention is not limited to the embodiments or the modification examples, and may be carried out by various forms within the scope without departing from the gist thereof.

The invention includes configurations (for example, configuration in which the functions, the methods and the results are the same or configuration in which the purposes and the effects are the same) that are substantially the same as the configurations which are described in the embodiments. Moreover, the invention also includes a configuration that is obtained by replacing a non-fundamental portion of the configurations which are described in the embodiments. Still more, the invention also includes a configuration that performs the same operations and the same effects or a configuration that may achieve the same purposes as the configurations which are described in the embodiments. The invention also includes a configuration that is obtained by adding a known technology to the configurations which are described in the embodiments.

What is claimed is:

1. A driving circuit for driving a capacitive load, comprising:
an integrated circuit that includes a modulator which generates a modulation signal by pulse-modulating a source signal;
a feedback circuit;
a transistor that generates an amplified modulation signal which is obtained by amplifying the modulation signal; and
a low-pass filter that generates a drive signal which is applied to the capacitive load by demodulating the amplified modulation signal,
wherein the feedback circuit generates a feedback signal on the basis of the drive signal, and feeds back the feedback signal to the modulator through a feedback terminal,
the modulator includes a first circuit block including an adder which is on a signal path from the feedback terminal to an output of the modulator, and a second circuit block including at least a circuit which is different from the adder of the modulator, and
the integrated circuit is configured to separate the first circuit block from the second circuit block by a triple-well structure,
wherein the triple-well structure includes
a first well and a second well corresponding to the first circuit block, wherein the first well is supplied a ground potential and the second well is supplied a first potential, and
a third well and a fourth well corresponding to the second circuit block, wherein the third well is supplied the ground potential and is formed within the fourth well and the fourth well is supplied a second potential, and
wherein the first well and the second well are separated from the third well and the fourth well.

2. The driving circuit for driving a capacitive load, according to claim 1,
wherein an area of the first well and the second well is smaller than an area of the third well and the fourth well in a planar view.

3. The driving circuit for driving a capacitive load, according to claim 1,
wherein the first circuit block further includes a signal level converter that converts a level of the feedback signal.

4. The driving circuit for driving a capacitive load, according to claim 1,
wherein the feedback circuit feeds back a signal of a high frequency band of the drive signal as the feedback signal.

5. The driving circuit for driving a capacitive load, according to claim 1,
wherein an oscillation frequency of the modulation signal is 1 MHz or higher to 8 MHz or lower.

6. An integrated circuit for driving a capacitive load, comprising:
a modulator that generates a modulation signal by pulse-modulating a source signal; and
a gate driver that generates an amplified control signal for controlling an output circuit which generates a drive signal which is applied to the capacitive load, on the basis of the modulation signal,
wherein a feedback signal which is generated on the basis of the drive signal, is fed back through a feedback terminal,
the modulator includes a first circuit block including an adder which is on a signal path from the feedback terminal to an output of the modulator, and a second circuit block including at least a circuit which is different from the adder of the modulator, and
the first circuit block and the second circuit block are configured to be separated by a triple-well structure,
wherein the triple-well structure includes
a first well and a second well corresponding to the first circuit block, wherein the first well is supplied a ground potential and the second well is supplied a first potential, and
a third well and a fourth well corresponding to the second circuit block, wherein the third well is supplied a ground potential and is formed within the fourth well and the fourth well is supplied a second potential, and
wherein the first well and the second well are separated from the third well and the fourth well.

* * * * *